US012660678B2

(12) United States Patent
Schmoelzer et al.

(10) Patent No.: US 12,660,678 B2
(45) Date of Patent: Jun. 16, 2026

(54) EMBEDDED PACKAGE WITH DELAMINATION MITIGATION

(71) Applicant: Infineon Technologies Austria AG, Villach (AT)

(72) Inventors: Bernd Schmoelzer, Radenthein (AT); Edward Fuergut, Dasing (DE); Ivan Nikitin, Regensburg (DE); Wolfgang Scholz, Olching (DE)

(73) Assignee: Infineon Technologies Austria AG, Villach (AT)

( * ) Notice: Subject to any disclaimer, the term of this patent is extended or adjusted under 35 U.S.C. 154(b) by 792 days.

(21) Appl. No.: 17/479,302

(22) Filed: Sep. 20, 2021

(65) Prior Publication Data

US 2023/0106642 A1 Apr. 6, 2023

(51) Int. Cl.
| | |
|---|---|
| *H10W 74/10* | (2026.01) |
| *H10W 20/20* | (2026.01) |
| *H10W 74/01* | (2026.01) |
| *H10W 74/47* | (2026.01) |
| *H05K 1/185* | (2026.01) |

(52) U.S. Cl.
CPC ......... *H10W 74/147* (2026.01); *H10W 20/20* (2026.01); *H10W 74/017* (2026.01); *H10W 74/127* (2026.01); *H10W 74/134* (2026.01); *H10W 74/47* (2026.01); *H05K 1/186* (2013.01)

(58) Field of Classification Search
CPC .............. H01L 23/31–3192; H05K 1/185–186
See application file for complete search history.

(56) References Cited

U.S. PATENT DOCUMENTS

| | | | |
|---|---|---|---|
| 5,701,034 A | 12/1997 | Marrs | |
| 7,667,306 B1 | 2/2010 | Fan | |
| 10,211,131 B1 | 2/2019 | Kitnarong et al. | |
| 10,347,554 B2 | 7/2019 | Santos et al. | |
| 2006/0040422 A1* | 2/2006 | Brand | H01L 23/4334 |
| | | | 257/E23.092 |
| 2016/0050768 A1 | 2/2016 | Chen et al. | |
| 2017/0257977 A1* | 9/2017 | Chainer | H01L 23/367 |
| 2017/0271229 A1* | 9/2017 | Santos | H01L 23/3675 |
| 2019/0198454 A1 | 6/2019 | Talledo | |
| 2020/0135602 A1 | 4/2020 | Zhang et al. | |
| 2021/0035879 A1* | 2/2021 | Kessler | H01L 25/105 |
| 2021/0127490 A1 | 4/2021 | Palm et al. | |

FOREIGN PATENT DOCUMENTS

KR     20060135424 A     12/2006

* cited by examiner

*Primary Examiner* — Steven B Gauthier
*Assistant Examiner* — Candice Chan
(74) *Attorney, Agent, or Firm* — Murphy, Bilak & Homiller, PLLC

(57) ABSTRACT

A semiconductor assembly includes a laminate substrate that includes a plurality of laminate layers of electrically insulating material stacked on top of one another, a semiconductor package that includes a package body of electrically insulating encapsulant material and a plurality of electrical contacts that are exposed from the package body, wherein the semiconductor package is embedded within the laminate layers of the laminate substrate, wherein the semiconductor package comprises a delamination mitigation feature, wherein the delamination mitigation feature comprises one or both of a macrostructure that engages with the laminate layers, and a roughened surface of microstructures that enhances adhesion between the semiconductor package and the laminate layers.

7 Claims, 7 Drawing Sheets

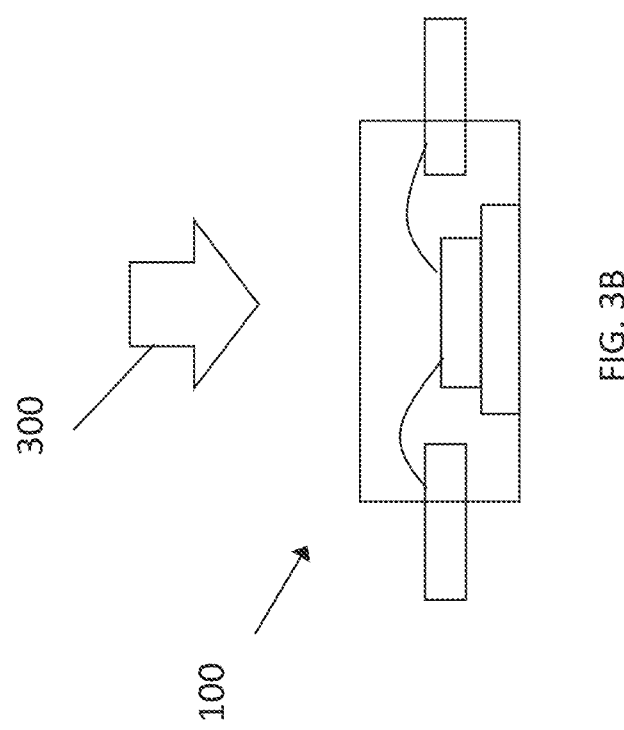
FIG. 3B
FIG. 3A
FIGURE 3
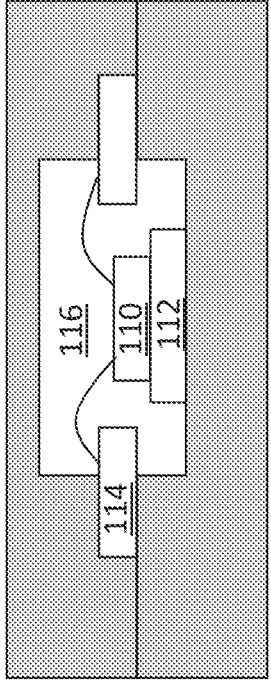

EMBEDDED PACKAGE WITH DELAMINATION MITIGATION

TECHNICAL FIELD

The instant application relates to semiconductor packaging, and more particularly to embedded semiconductor packages.

BACKGROUND

Embedded device technology refers to a packaging technique wherein a PCB (printed circuit board) like structure is used to package electrical components within the PCB. The electrical components can be active or passive components that are embedded within the laminate material of the PCB. This solution has certain advantages such as high integration density, low parasitic effects, and high reliability and high power cycling robustness. For high power applications wherein the devices are required to accommodate voltages of at least 100V and more typically 600V, 1200V or more, embedded device technology presents unique design challenges. In particular, the high electric fields associated with power device operation make it difficult to form reliable electrical connections and adequate electrical isolation between the devices. One way to avoid these drawbacks is to embed a discrete semiconductor package within the printed circuit board. As the discrete semiconductor package is designed as a standalone component that is pre-qualified and designed to withstand high electric fields, this avoids some of the above-mentioned issues. However, embedding a discrete semiconductor package within a printed circuit board creates particular challenges with respect to robustness and reliability.

SUMMARY

Those skilled in the art will recognize additional features and advantages upon reading the following detailed description, and upon viewing the accompanying drawings.

A semiconductor assembly is disclosed. According to an embodiment, the semiconductor assembly comprises a laminate substrate that comprises a plurality of laminate layers of electrically insulating material stacked on top of one another, a semiconductor package that comprises a package body of electrically insulating encapsulant material and a plurality of electrical contacts that are exposed from the package body, wherein the semiconductor package is embedded within the laminate layers of the laminate substrate, wherein the semiconductor package comprises a delamination mitigation feature, wherein the delamination mitigation feature comprises one or both of: a macrostructure that engages with the laminate layers, and a roughened surface of microstructures that enhances adhesion between the semiconductor package and the laminate layers.

Separately or in combination, the laminate substrate comprises a first structured metallization layer disposed on outer surface of the laminate substrate, and electrically conductive through-vias extending through the laminate layers, wherein the first structured metallization layer comprises a contact pad that is electrically connected to one of the electrical contacts from the semiconductor package by one of the electrically conductive through-vias.

Separately or in combination, the encapsulant material of the semiconductor package comprises a mold compound, and wherein the laminate layers are layers of fiberglass or resin material.

Separately or in combination, the delamination mitigation feature comprises the macrostructure.

Separately or in combination, the electrical contacts of the semiconductor package are metal leads that protrude out from outer edge sides of the semiconductor package, wherein outer portions of metal leads are bent towards the package body, and wherein the macrostructure is a channel formed by interior surfaces of the metal leads that face the package body.

Separately or in combination, the macrostructure is a depression formed in a main surface of the package body.

Separately or in combination, the macrostructure is a channel that extends along an outer edge side of the package body.

Separately or in combination, the delamination mitigation feature comprises roughened surface of microstructures.

Separately or in combination, the roughened surface of microstructures is disposed on the package body.

Separately or in combination, the roughened surface of microstructures is disposed on a metal surface of the semiconductor package.

A method of forming a semiconductor assembly is disclosed. According to an embodiment, the method comprises providing a semiconductor package that comprises a package body of electrically insulating encapsulant material and a plurality of electrical contacts that are exposed from the package body, forming a delamination mitigation feature in the semiconductor package, and embedding the semiconductor package in a laminate substrate that comprises a plurality of laminate layers of electrically insulating material stacked on top of one another, wherein the delamination mitigation feature prevents delamination between a surface of the semiconductor package and the laminate layers.

Separately or in combination, the delamination mitigation feature comprises one or both of a macrostructure that engages with the laminate layers, and a roughened surface of microstructures that enhances adhesion between the semiconductor package and the laminate layers.

Separately or in combination, providing the semiconductor package comprises forming the package body by a molding process, and wherein the delamination mitigation feature is formed during the molding process.

Separately or in combination, forming the delamination mitigation feature comprises adapting a molding cavity of the molding process to produce the package body to have the roughened surface of microstructures.

Separately or in combination, forming the delamination mitigation feature comprises using pins to displace liquified encapsulant material during the molding process, and wherein depressions formed by the pins form the macrostructure that engages with the laminate layers.

Separately or in combination, the delamination mitigation feature is formed in the semiconductor package after providing the semiconductor package.

Separately or in combination, forming the delamination mitigation feature comprises performing one or more process steps that increase the surface area of an outer surface of the semiconductor package.

Separately or in combination, the one or more process steps comprise removing portions of the encapsulant material so as to form a channel in the package body, and wherein and the channel forms the macrostructure that engages with the laminate layer.

Separately or in combination, forming the delamination mitigation feature comprises performing a surface treatment to the semiconductor package that creates the roughened surface of microstructures in the package body.

Separately or in combination, the semiconductor package comprises a mold tool release agent on the package body, and wherein forming the delamination mitigation feature comprises removing the mold tool release agent from the package body.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 3, which includes FIGS. 3A and 3B, schematically illustrates techniques for forming a delamination mitigation feature in a semiconductor package, according to an embodiment. FIG. 3A illustrates forming the delamination mitigation feature during a molding process; and FIG. 3B illustrates forming the delamination mitigation feature in a completed semiconductor package.

FIGS. 7A and 7B illustrate cross-sectional profiles of the channel; and FIG. 4C illustrates potential profiles of the roughened surface.

DETAILED DESCRIPTION

Embodiments of a semiconductor assembly that comprises a laminate substrate and a semiconductor package that is embedded within the laminate substrate are described herein. The molded semiconductor package comprises one or more delamination mitigation features disposed on an exterior surface of the semiconductor package. The delamination mitigation features advantageously prevent or at least mitigate the problem of laminate material separating from the exterior surface of the semiconductor package. The delamination mitigation features may include a macrostructure that engages with the laminate material to resist movement of the laminate material away from the semiconductor package. Additionally or alternatively, the delamination mitigation features may include a roughened surface of microstructures that enhance adhesion between the laminate material and the molded semiconductor package during the lamination process, thereby creating a stronger bond that resists delamination.

Figures 1, 1A, 1B:
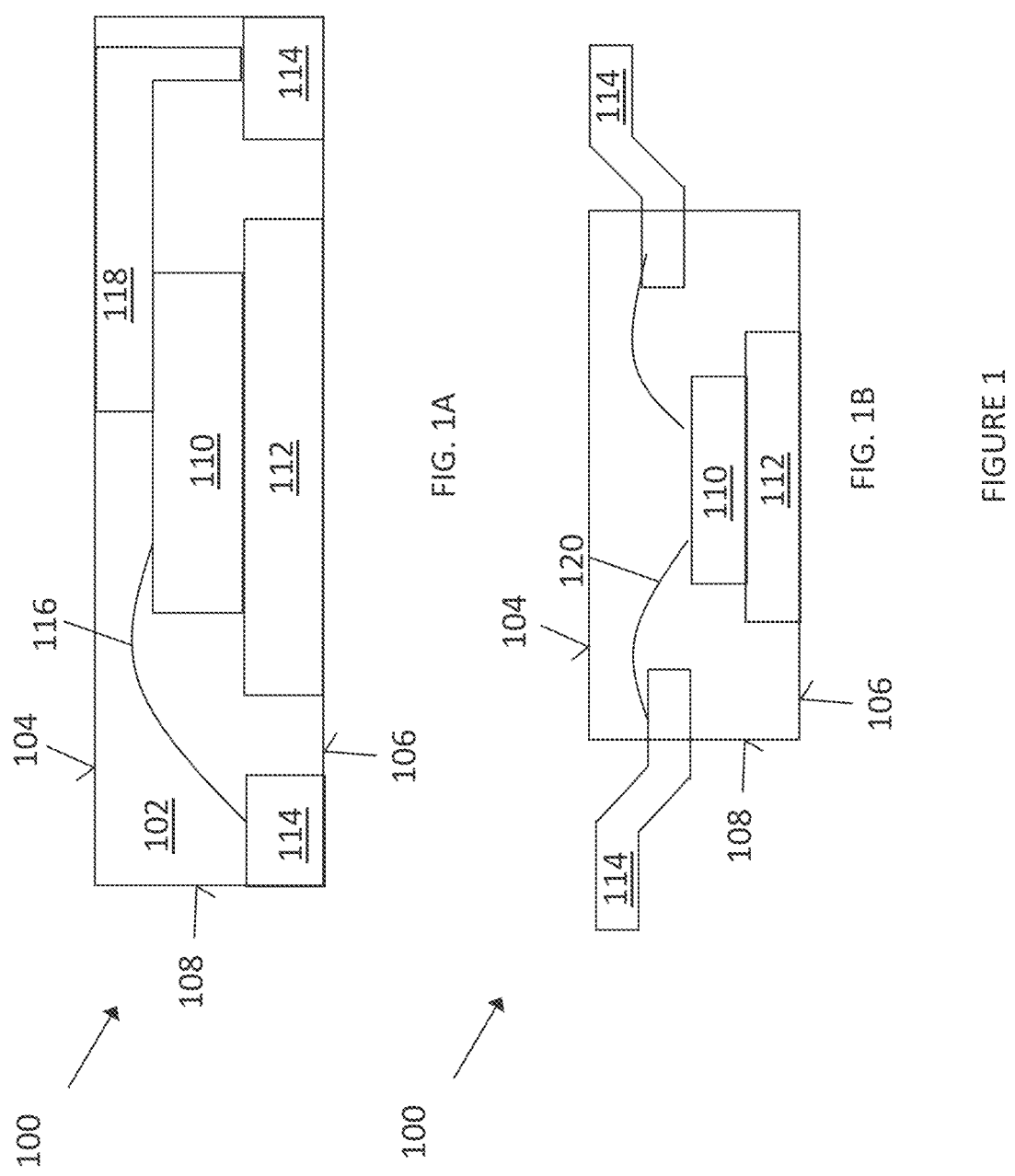
FIG. 1, which includes FIGS. 1A and 1B, schematically illustrates a semiconductor package, according to an embodiment.
FIG. 1A illustrates a leadless package.
FIG. 1B illustrates a leaded package.

Referring to FIG. 1, a semiconductor package 100 that comprises a package body 102 of encapsulant material is depicted. The encapsulant material can comprise any one or combination of: epoxy, filled epoxy, glass fiber materials, glass fiber filled epoxy, imide, thermoplast materials, thermoset polymer, polymer blends, etc. The package body 102 comprises an upper surface 104 and a lower surface 106 opposite from the upper surface 104. The encapsulant body further comprises outer edge sides 108 extending between the upper and lower surfaces 104, 106.

The semiconductor package 100 comprises a semiconductor die 110 that is encapsulated by the encapsulant material and a plurality of electrical contacts that are exposed from the package body 102. Generally speaking, the semiconductor die 110 can have a wide variety of device configurations. For example, the semiconductor die 110 can be configured as a discrete device, e.g., a MOSFET (Metal Oxide Semiconductor Field Effect Transistor), an IGBT (Insulated Gate Bipolar Transistor), an HEMT (High Electron Mobility Transistor), diode, etc. Alternatively, the semiconductor die 110 can be configured as an integrated circuit device, e.g., driver, logic device, etc. The semiconductor die 110 can include IV semiconductor materials, e.g., silicon, silicon germanium, silicon carbide, etc., and/or type III-V semiconductor materials, e.g., gallium nitride, gallium arsenide, etc. The semiconductor die 110 can be configured as a vertical device, which refers to a device that is configured to current flowing between a main surface and an opposite facing rear surface of the semiconductor die 110. Alternatively, the semiconductor die 110 can be configured as a lateral device, which refers to a device that is configured to control current flowing parallel to a main surface of the semiconductor die 110.

According to an embodiment, the semiconductor die 110 is configured as a discrete power transistor. A discrete power transistor is a switching device that is rated to accommodate voltages of at least 100 V (volts) and more commonly on the order of 600 V, 1200V or more and/or is rated to accommodate currents of at least 1 A (amperes) and more commonly on the order of 10 A, 50 A, 100 A or more. Exemplary device types of discrete power transistors include MOSFETs (Metal Oxide Semiconductor Field Effect Transistors), IGBTs (Insulated Gate Bipolar Transistors), and HEMTs (High Electron Mobility Transistors), for example.

Instead of a single die configuration (as shown), the semiconductor package 100 may comprise multiple semiconductor dies 110, with each of these semiconductor dies 110 having any of the above-discussed configurations. For example, the semiconductor package 100 may comprise any one or combination of the following: a driver die integrated in combination with a power transistor die, a reverse conducting diode integrated in combination with a power transistor die, two or more power transistor dies connected in parallel with one another, and two power transistor dies connected in series with one another, e.g., to form a half-bridge circuit.

The semiconductor die 110 may be mounted on a lead frame that comprises a die pad 112 and a plurality of electrically conductive leads 114. The lead frame may comprise an electrically conductive metal such as copper, nickel, aluminum, palladium, gold, and alloys or combinations thereof. The lead frame can be provided from a substantially uniform thickness piece of sheet metal, and the die pad 112 and leads 114 of the lead frame can be created by performing metal processing techniques such as stamping, punching, etching, bending, etc., on this planar sheet of metal. The lead frame can comprise a core of low-resistance metal, e.g., copper, aluminum, and one or more coatings, e.g., adhesion promotors, anti-oxidation coatings, etc. on an exterior surface of the lead frame. In other embodiments, the semiconductor die 110 can be mounted on other types of carrier structures, such as a DCB (direct bonded copper) substrate, IMS (insulated metal substrate) substrate, AMB (active metal brazed) substrate.

The leads 114 of the semiconductor package 100 provide electrical contacts of the semiconductor package 100 that provide external electrical accessibility to the various terminals of the semiconductor die 110. To this end, the semiconductor package 100 may comprise bond wires 116 and/or metal clips 118. In the example of FIG. 1A, metal clip 118 is exposed from the package body 102 so as to provide an additional electrical contact at the upper surface 104. Both examples of FIG. 1A and FIG. 1B comprise an exposed die pad 112 at the lower surface 106 of the package body. This exposed die pad 112 may provide an additional electrical contact at the lower surface 106, e.g., in the case of a vertical device with a lower surface terminal that is soldered to the die pad 112.

The embodiments of FIGS. 1A and 1B illustrate two different examples of a so-called SMD (surface-mount device) configuration, which refers to a package configuration wherein the contact surfaces of the leads 114 are coplanar with a mounting surface (e.g., the lower surface 106) of the semiconductor package 100, thereby enabling surface mounting on a carrier such as a PCB or power electronics substrate. In the example of FIG. 1A, the package has a so-called no-lead configuration wherein the leads 114 are configured as contact structures that are coplanar with the surfaces of the package body 102. In the example of FIG. 1B, leads 114 protrude out from the outer edge sides 108 of the semiconductor package 100 and are bent in such a way that provides an SMD package configuration. More generally, the concept disclosed herein is applicable to packages with a variety of different lead configurations, e.g., QFN (quad-flat no-leads), DFN (dual-flat no-leads), TSC (top-side cooling) configurations wherein a die pad is exposed at an opposite side as the contacting surface of the leads, BSC (bottom-side cooling) wherein a die pad is exposed at the same side as the contacting surface of the leads, through-hole configurations, etc.

Figure 2:
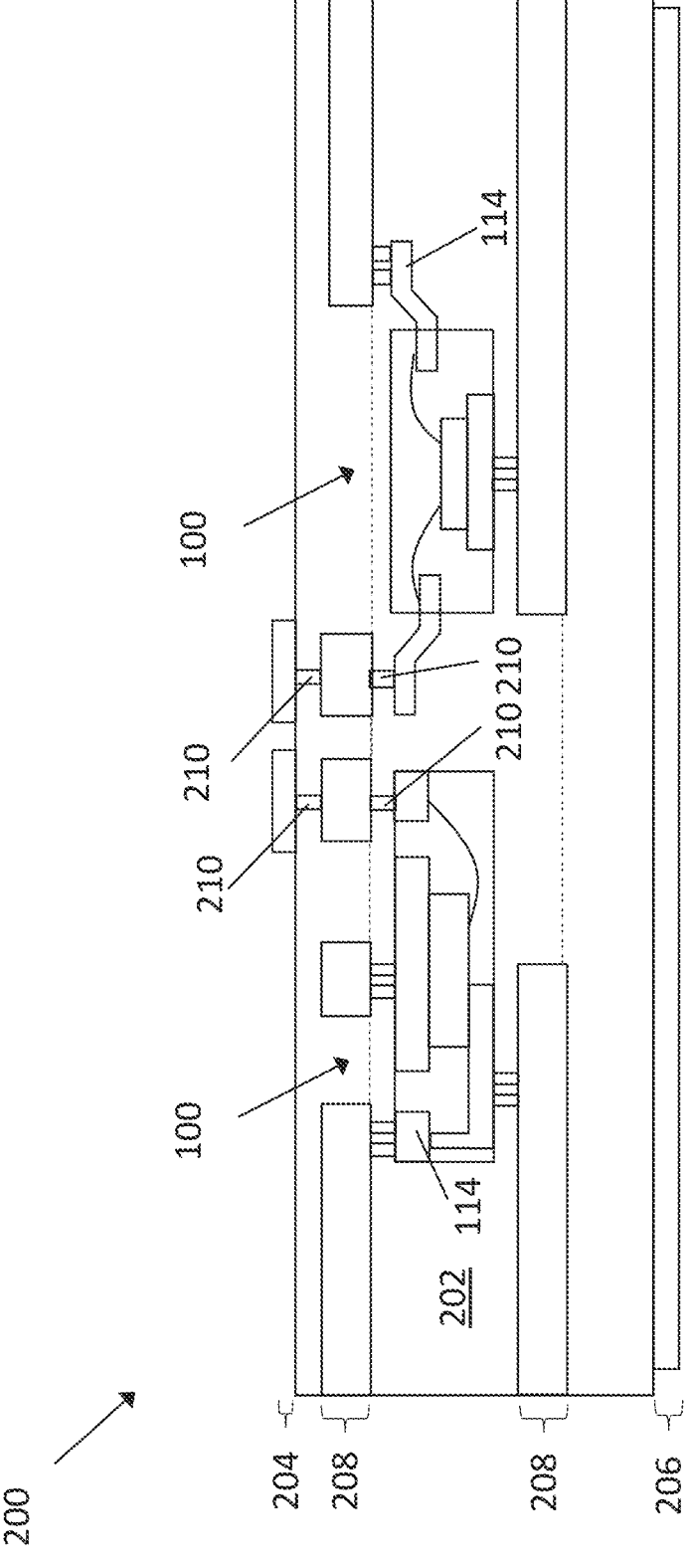
FIG. 2 schematically illustrates a laminate substrate having semiconductor packages embedded within the laminate substrate, according to an embodiment.

Referring to FIG. 2, a laminate substrate 200 that comprises a plurality of laminate layers 202 is depicted. The laminate substrate 200 is formed by a lamination technique wherein multiple laminate layers 202 are successively stacked on top of one another. Each constituent laminate layer 202 can comprise any dielectric material that is suitable for lamination such as a fiberglass or resin material. More particularly, the laminate layers 202 can be layers of or comprise epoxy materials, blended epoxy and glass fiber materials such as FR-4, FR-5, CEM-4, etc., and resin materials such as bismaleimide trazine (BT) resin. The laminate substrate 200 additionally comprises multiple layers of metallization, e.g., copper, aluminum, etc., and alloys thereof, formed on top of at least some of the constituent laminate layers 202. These layers of metallization comprise first and second metallization layers 204, 206 each being disposed on outer surfaces of the laminate substrate 200. The first metallization layer 204 may be structured into a number of contact pads that are electrically isolated from one another and form external terminals of the device. The second metallization layer 106 may be a continuous layer that allows for the laminate substrate 200 to be mounted on an external heat sink structure (not shown). Alternatively, the second metallization layer 106 may be structured into a number of contact pads in a similar manner as the first metallization layer 204. The laminate substrate 200 may also comprise internal layers of metallization 208 that are interposed between different laminate layers 202. These internal layers of metallization 208 can be structured to form internal interconnect lines. The laminate substrate 200 additionally comprises electrically conductive through-vias 210, e.g., vias comprising tungsten, copper, etc., extending through the laminate layers 202. The contact pads of the first structured metallization layer 204 may be electrically connected one of the electrical contacts, e.g., the leads 114, from the semiconductor package 100 by one of the electrically conductive through-vias, thereby providing external electrical accessibility to the various leads 114 of the semiconductor package 100.

The semiconductor package 100 is embedded within the laminate layers 202 of the laminate substrate 200. That is, the laminate substrate 200 is formed such that one or more electrically insulating layers of laminate material surround and electrically isolate the semiconductor package 100. As shown, both examples of the semiconductor package 100 described with reference to FIG. 1A are embedded within the laminate layers 202 of the laminate substrate 200. More generally, any type or number of the semiconductor packages 100 may be embedded within the laminate layers 202.

According to one example of a lamination technique, a laminate layer 202 comprising glass fiber material such as FR-4, FR-5, CEM-4, etc. is formed to be thicker than an overall height of the semiconductor package 100. Subsequently, an opening that is dimensioned to accommodate the semiconductor package 100 is formed in this laminate layer. The semiconductor package 100 is then placed in this opening. A further lamination step is then performed wherein the opening comprising the semiconductor package 100 is filled with a further lamination material such as a resin material. The through-vias 210 that are connected with terminals of the semiconductor die 110 may be formed by a sequence of etching the laminate material and galvanic deposition, for example.

The semiconductor assembly comprising the semiconductor package 100 embedded within the laminate substrate 200 is susceptible to delamination between the laminate material and the outer surfaces of the semiconductor package 100. That is, the laminate material can separate from any or all of the surfaces of the semiconductor package 100 during manufacture of the laminate substrate 200 or subsequent operation. This can be caused by moisture and/or voids accumulating between the semiconductor package 100 and the laminate material, and insufficient interlock between the between the semiconductor package and the laminate material. Separately or in combination, delamination may occur due to differences in coefficient of thermal expansion between different materials, such as between a laminate material and a mold compound. For example, processes such soldering processes that are used to form the electrical connections of the laminate substrate 200, are performed at temperatures in excess of 300° C. Moreover, the device during operation may be subject to dramatic swings in temperature. These temperature changes can cause thermal expansion and subsequent contraction at different rates, which may induce stress and cracking.

The semiconductor package 100 comprises at least one delamination mitigation feature 122 (examples depicted in FIGS. 4-7). The delamination mitigation feature 122 prevents delamination between a surface of the semiconductor package 100 and the laminate layers 202. That is, the geometry of the delamination mitigation feature 122 and the manner in which it interfaces with the laminate material either eliminates or makes it less likely that the laminate material will separate from the surface of the semiconductor package 100 under thermal cycling. The delamination mitigation feature 122 can be disposed on any outer surface of the semiconductor package 100 that interfaces with the laminate material of the laminate substrate 200. These surfaces include all surfaces of the package body 102, any exposed metal surface of the leads 114, and exposed metal surface of the die pad 112, and any exposed metal surfaces of a clip 118 (if present).

The delamination mitigation feature 122 can be a macrostructure that engages with the laminate layers 202. A macrostructure refers to a projection or recess in an otherwise planar surface of the semiconductor package 100 with a minimum dimension (height or width) of at least 10 µm (microns) and more typically on the order of 100 µm and a maximum dimension generally in the range of 2-3 mm (millimeters) or more. In principle, a macrostructure can be as large as the overall size of the semiconductor package 100 will accommodate. The macrostructure may be sufficiently large to engage surfaces of the semiconductor package 100 with the laminate material to form an interlocked connection between the semiconductor package 100 and the laminate material. This provides an anchoring effect that resists the pulling apart of the two elements. Moreover, the macrostructure may also increase the surface area of the semiconductor package 100, thus improving adhesion with the laminate material. Alternatively or in combination, the delamination mitigation feature 122 can be a roughened surface of microstructures that enhances adhesion between the semiconductor package 100 and the laminate layers 202. A microstructure refers to a projection or recess in an otherwise planar surface of the semiconductor package 100 with a minimum dimension (height or width) of no greater than 10 µm and no less than 1 µm. A surface with these microstructures has better adhesion with—and consequently greater resistance to separation from—the laminate material of the laminate layers 202 due to the bonding that occurs on a microscopic level.

Referring to FIG. 3, the semiconductor package 100 may be provided by performing a molding process. According to this technique, a lead frame assembly comprising the semiconductor die 110 mounted on the die pad 112 and electrically connected to the leads 114 is arranged within a cavity 116 of a mold tool. The cavity 116 of a mold tool is filled with liquified mold compound, e.g., epoxy, polymers, thermosetting plastic, etc. so as to form the package body 102. The liquified mold compound subsequently cools and hardens. Examples of these techniques include injection molding, transfer molding, compression molding and film assisted molding equipment (FAME) molding techniques.

According to an embodiment, the delamination mitigation feature 122 is formed during the molding process. That is, specific measures are taken to adapt the cavity 116 of the mold tool so that the package body 102 is initially formed to have the desired geometry after the liquified mold compound subsequently cools and hardens.

According to an embodiment, the delamination mitigation feature 122 is formed in the semiconductor package 100 after providing the semiconductor package 100. That is a semiconductor package 100 may be provided, e.g., by a molding process as described above or by another encapsulation technique such as lamination, and one or more process steps 300 are performed after providing the semiconductor package 100 to form the delamination mitigation feature 122. These process steps 300 intentionally increase the surface area of an outer surface of the semiconductor package 100 so as to create the microstructures or the macrostructures. In this case, the additional process steps 300 used to create the delamination mitigation feature 122 may be performed by a different manufacturer as the producer of the semiconductor package 100.

Figures 4, 4A, 4B, 4C:
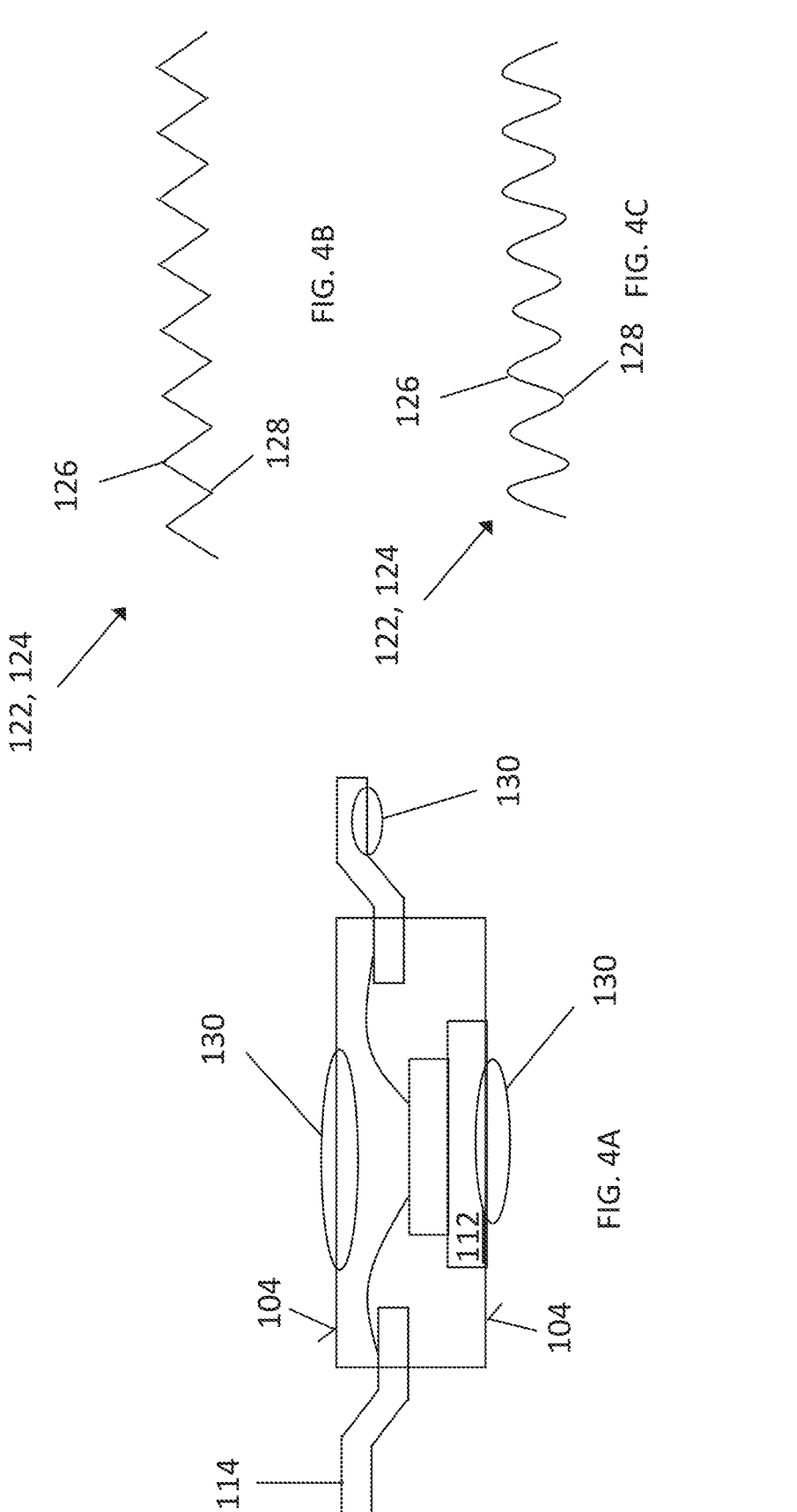
FIG. 4, which includes FIGS. 4A, 4B and 4C, schematically illustrates a semiconductor package with a delamination mitigation feature that is a roughened surface of microstructures, according to an embodiment.
FIG. 4A illustrates potential locations for the roughened surface.
FIGS. 4B and 4C illustrate potential profiles of the roughened surface.

Referring to FIG. 4, examples of an embodiment wherein the delamination mitigation feature 122 comprises a roughened surface 124 of microstructures is shown. The roughened surface 124 of microstructures comprises a varying surface profile with apexes 126 and nadirs 128 disposed between the apexes 126. Generally speaking, a maximum amplitude of the varying surface profile, i.e., the separation distance between the apexes 126 and nadirs 128 may depend on the production technique and can be less than 0.5 µm, e.g., between 100 nm and 250 nm. A maximum separation distance between the apexes 126 may be between 2 µm and 1 µm in some embodiments. More generally the maximum separation distance between the apexes 126 may be up to 10 µm or higher. The varying surface profile may comprise acute angled transitions, e.g., as shown in FIG. 4B, or may be an undulating profile, e.g., as shown in FIG. 4C. Moreover, the apexes 126 and nadirs 128 may occur in a regular patten or may occur at random spacing intervals. Geometric parameters such as density, height, and lateral spacing of the apexes 126 and nadirs 128 may be adapted to a particular laminate resin material or process for enhanced adhesion.

The roughened surface 124 of microstructures may be provided on any exposed surface 130 of the semiconductor package 100. For example, the roughened surface 124 of microstructures may be disposed on the upper the upper surface 104, the lower surface 106, or any of the outer edge sides 108 of the package body 102. In addition or alternatively, the roughened surface 124 of microstructures may be disposed on a metal surface of the semiconductor package 100, e.g., any exposed surface of the leads 114 and/or the die pad 112 and/or the metal clip 114 (if present).

According to an embodiment wherein the roughened surface 124 is formed on a surface of the package body 102, the roughened surface 124 may be formed by adapting the cavity 116 of a molding process to produce the package body 102 to have a roughened surface 124. For example, the surfaces of the cavity 116 of the mold tool may be intentionally roughened, e.g., by a sand blasting or a shot peening process. This roughened surface 124 of the mold tool cavity 116 is then translated to the outer sides of the mold body.

Alternatively, the roughened surface 124 may be formed by process steps 300 that occur after the encapsulation process is complete. According to these techniques, a surface treatment is applied to the semiconductor package 100 that creates the roughened surface 124. Examples of these surface treatments that may be performed in include laser treatment, plasma, blasting, and mechanical processes such as grinding, for example. These techniques may be used to create the roughened surface 124 in the package body 102 or in a metal surface of the semiconductor package 100. One particular type of surface treatment that may be performed is the removal of a release agent from the package body 102. Molding processes such as compression molding may utilize a releasing agent, such as a silicone or epoxy based liquid or gel, on the surfaces of the molding tool to aid in the separation of the package body 102 from the molding tool once molding is complete. However, these releasing agents may remain on the surface of the package body 102 and create a smooth surface that is susceptible to delimitation. Embodiments described herein include a specific process step of removing the mold tool release agent from the package body 102 so as to expose the rougher underlying surface of the package body 102. This may be done through chemical or mechanical treatments, for example.

Figures 5, 5A, 5B:
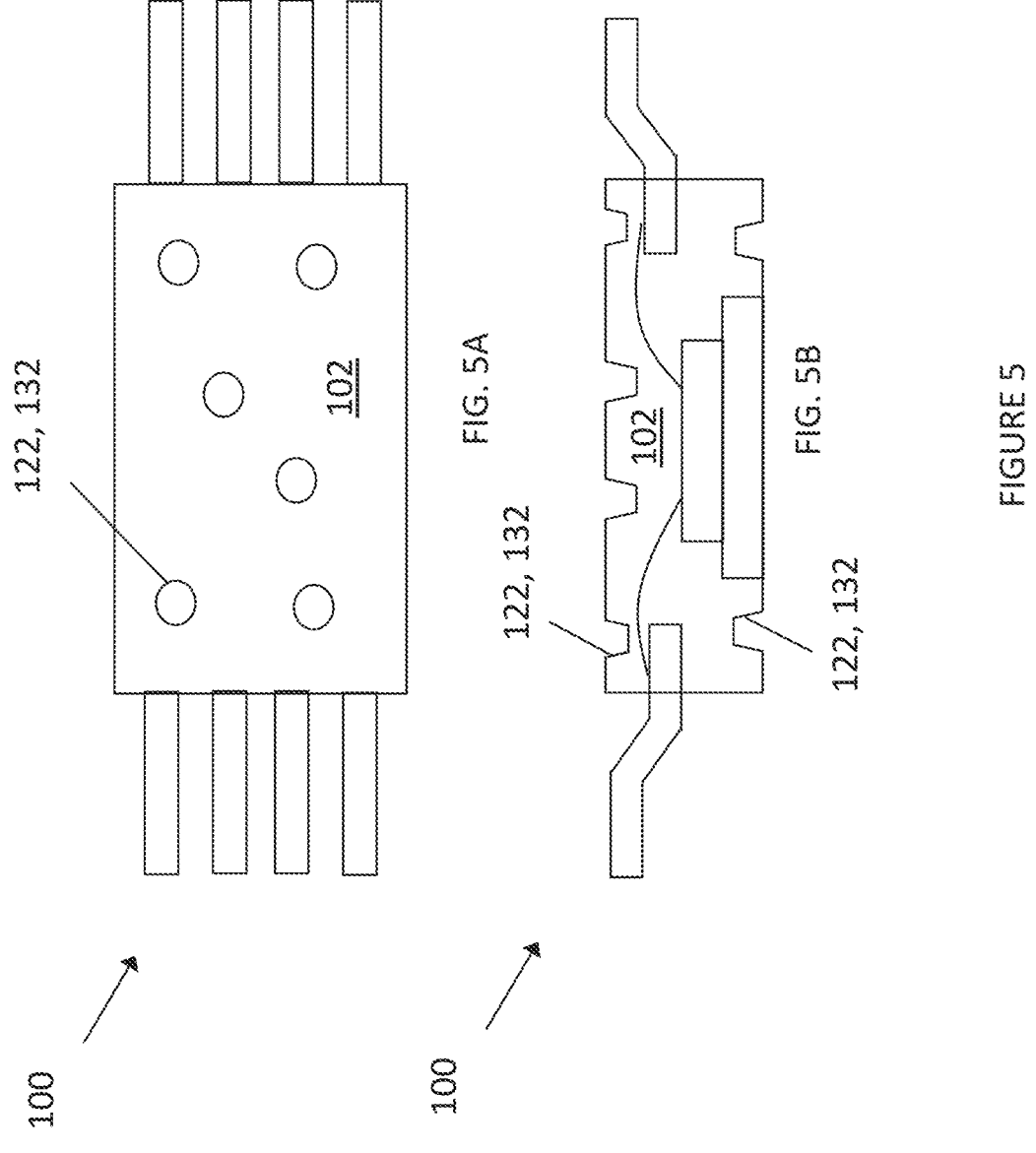
FIG. 5, which includes 5A and 5B, schematically illustrates a semiconductor package with a delamination mitigation feature that is a depression in the encapsulant body, according to an embodiment.
FIG. 5A illustrates a plan-view of the depressions.
FIG. 5B illustrates cross-sectional views of the depressions.

Referring to FIG. 5, an example of an embodiment wherein the delamination mitigation feature 122 comprises a macrostructure is shown. In this embodiment, the delamination mitigation feature 122 comprises an intentionally formed depression 132 or depressions 132 in the package body 102. Generally speaking, a depth of these depressions 132 can be in the range of 100 μm to 1500 μm. A diameter of these depressions 132 can likewise be in the range of 100 μm to 2000 μm. The depression 132 mitigates delamination by increasing the surface area of the package body 102 and by receiving a correspondingly shaped protrusion from the laminate material. This protrusion may mitigate lateral expansion of the laminate material relative to the mold body. This is particularly so if there are multipole depressions 132 on a surface and hence multiple protrusions engaging with one side of the semiconductor package 100.

The depressions 132 in the package body 102 may be formed during a molding process. According to one technique, the depressions 132 are formed by pins that displace liquified encapsulant material during the molding process. According to this technique, before the mold cavity 116 is filled with liquified mold material, fixed pins are arranged over the assembly, e.g., over the semiconductor die 110 and/or over the lead frame. The fixed pins have a geometry corresponding to the desired geometry of the depressions 132. These fixed pins displace the liquified material, thereby creating a void in the encapsulant body. This technique may be used to form the depressions 132 at either one of the upper and lower surfaces 104, 106 of the package body. According to another technique, the depressions are formed in a completed semiconductor package. For example, similar or identical shaped depressions 132 may be formed by etching techniques or mechanical techniques such as grinding or drilling.

Figure 6:
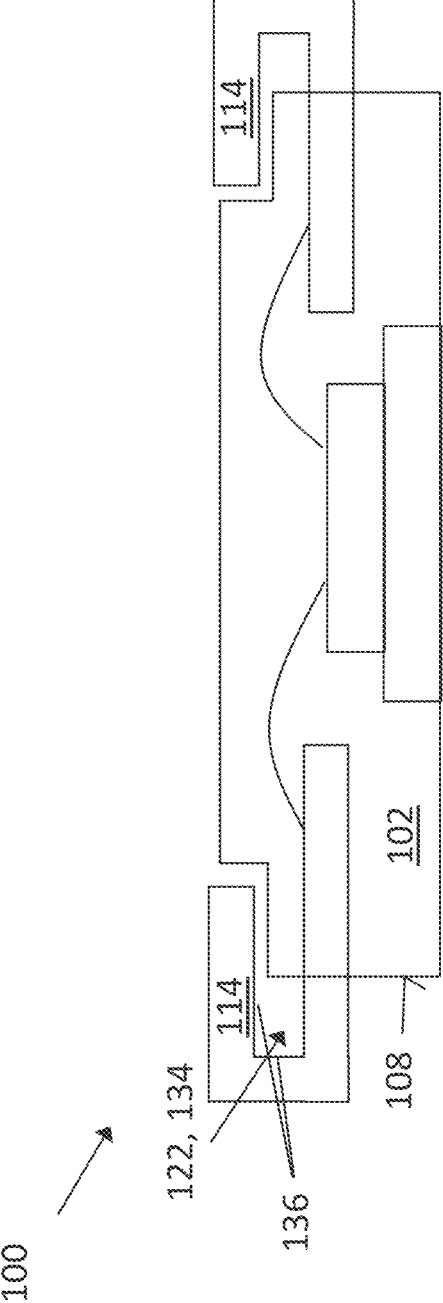
FIG. 6 schematically illustrates a semiconductor package with a delamination mitigation feature that is a channel formed by bent leads, according to an embodiment.

Referring to FIG. 6, an example of an embodiment wherein the delamination mitigation feature 122 comprises a macrostructure is shown. In this embodiment, the delamination mitigation feature 122 is provided by a geometric configuration of the package leads 114. In particular, the macrostructure is a channel 134 formed from the leads 114. In this case, semiconductor package 100 comprises leads 114 that protrude out from outer edge sides 108 of the semiconductor package 100 and bend back towards the towards the outer edge sides 108, i.e., in an opposite direction as the portions protruding from the outer edge sides 108, thereby creating a channel 134=in the interior surfaces 136 of the leads 114 that face the package body 102. This channel 134 engages with the laminate material in the laminate substrate 200 so as to oppose the movement of the laminate material away from the semiconductor package 100. This configuration may be obtained by performing bending or punching processes to the leads 114 after forming the package body 102. As shown, the package body 102 may be adapted to comprise indentations that accommodate the outer ends of the leads 114. The laminate material may accumulate within these indentations between the package body 102 and the leads 114, thereby improving interlock. In general, the channel 134 may have any geometry with a defined bottom and outer sidewalls. The channel 134 may be formed by leads 114 that are curved and/or extend in multiple retrograde directions, e.g., zig-zag.

Figure 7:
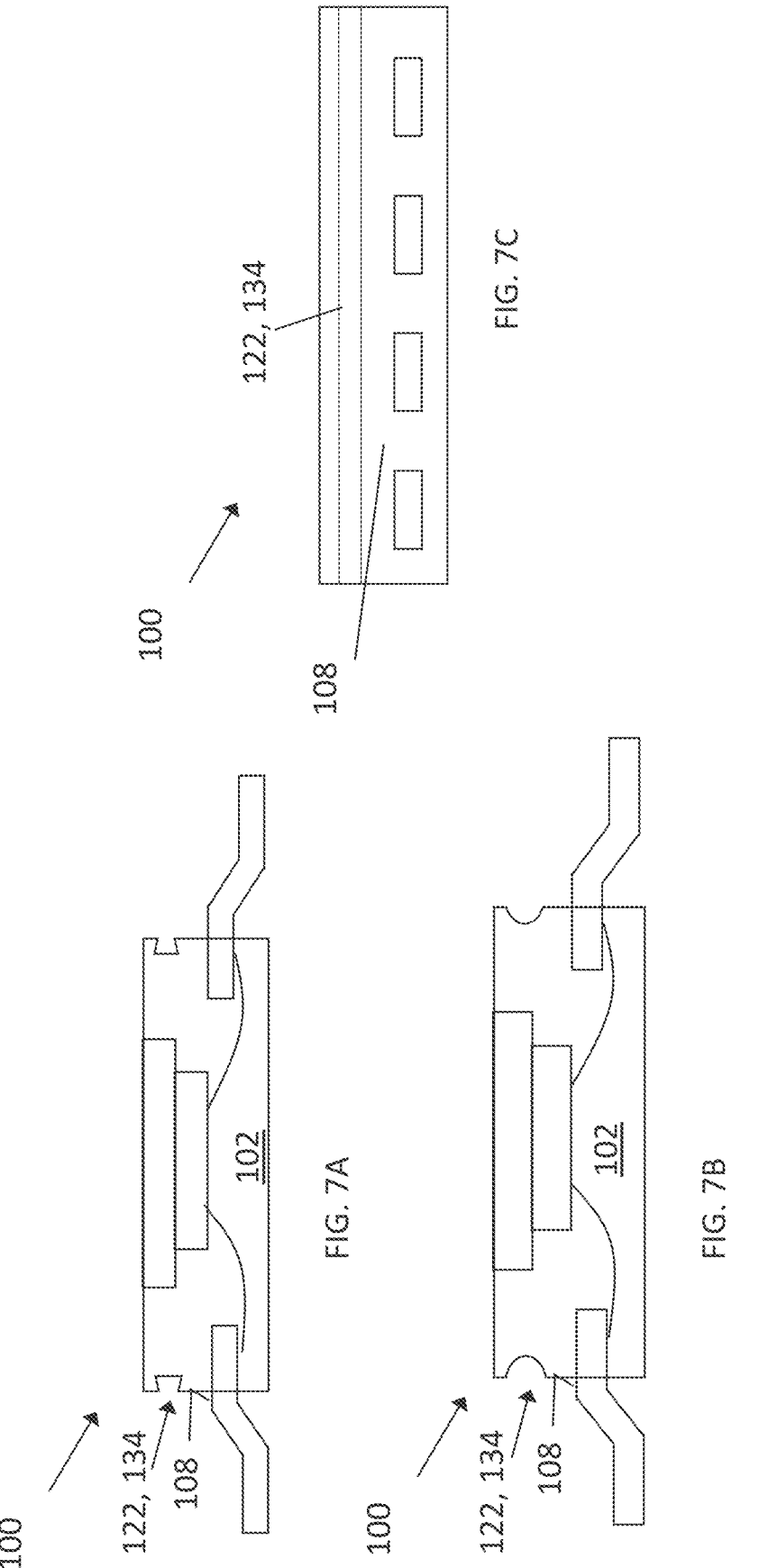
FIG. 7, which includes FIGS. 7A, 7B and 7C, schematically illustrates a semiconductor package with a delamination mitigation feature that is a channel formed in an outer edge sides of the package body, according to an embodiment.

Referring to FIG. 7, an example of an embodiment wherein the delamination mitigation feature 122 comprises a macrostructure is shown. In this embodiment, the delamination mitigation feature 122 is provided by a channel 134 that extends along an outer edge side 108 of the package body 102. In this case, the channel 134 has a defined bottom and outer sidewalls that are formed in the package body 102. The channel 134 may extend longitudinally along a complete outer edge side 108 of the semiconductor package 100, as shown. Alternatively, the channel 134 may extend along only a part of the outer edge side 108. The channel 134 may be formed during a molding process, e.g., by adapting the geometry of the mold cavity 116. Alternatively, the channel 134 may be formed in a completed semiconductor package by removing portions of the encapsulant material from the package body 102. For example, a chemical etching or mechanical grinding process may be performed. As can be appreciated from FIGS. 7A and 7B, different cross-sectional geometries of the channel 134 may be possible. These cross-sectional geometries may include retrograde angles so as to enhance the interlocking effect between the laminate material and the package body 102, e.g., as shown in FIG. 7A.

To the extent possible and not inconsistent, the various embodiments of the delamination mitigation feature 122 may be combined with one another in a single semiconductor package 100. For example, the roughened surface 124 of microstructures may be combined with one, two or more of the different macrostructures in a single semiconductor package 100. Moreover, the semiconductor package 100 comprising the delamination mitigation feature 122 in the figures is used for illustration purposes only. To the extent possible and not inconsistent, the delamination mitigation feature 122 may be provided in any package type, including both types of packages shown in FIGS. 1A and 1B.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A method of forming a semiconductor assembly, the method comprising:

providing a semiconductor package that comprises a package body of electrically insulating encapsulant material and a plurality of electrical contacts that are exposed from the package body;

forming a delamination mitigation feature in the semiconductor package; and embedding the semiconductor package in a laminate substrate that comprises a plurality of laminate layers of electrically insulating material stacked on top of one another, wherein the delamination mitigation feature prevents delamination between a surface of the semiconductor package and the laminate layers, wherein the delamination mitigation feature comprises one or both of:

a macrostructure that engages with the laminate layers; and a roughened surface of microstructures that enhances adhesion between the semiconductor package and the laminate layers, wherein providing the semiconductor package comprises forming the package body by a molding process, and wherein the delamination mitigation feature is formed during the molding process, wherein forming the delamination mitigation feature comprises adapting a molding cavity of the molding process to produce the package body to have the roughened surface of microstructures.

2. The method of claim 1, wherein forming the delamination mitigation feature comprises using pins to displace liquified encapsulant material during the molding process, and wherein depressions formed by the pins form the macrostructure that engages with the laminate layers.

3. The method of claim 1, wherein the delamination mitigation feature is formed in the semiconductor package after providing the semiconductor package.

4. The method of claim 3, wherein forming the delamination mitigation feature comprises performing one or more process steps that increase the surface area of an outer surface of the semiconductor package.

5. The method of claim 4, wherein the one or more process steps comprise removing portions of the encapsulant material so as to form a channel in the package body, and wherein the channel forms the macrostructure that engages with the laminate layer.

6. The method of claim 4, wherein forming the delamination mitigation feature comprises performing a surface treatment to the semiconductor package that creates the roughened surface of microstructures in the package body.

7. The method of claim 6, wherein the semiconductor package comprises a mold tool release agent on the package body, and wherein forming the delamination mitigation feature comprises removing the mold tool release agent from the package body.

* * * * *